United States Patent

Beinglass et al.

[11] Patent Number: 5,645,646
[45] Date of Patent: Jul. 8, 1997

[54] SUSCEPTOR FOR DEPOSITION APPARATUS

[75] Inventors: Israel Beinglass, Sunnyvale; Mahalingam Venkatesan; Roger N. Anderson, both of San Jose, all of Calif.

[73] Assignee: Applied Materials, Inc., Santa Clara, Calif.

[21] Appl. No.: 752,742

[22] Filed: Nov. 14, 1996

Related U.S. Application Data

[63] Continuation of Ser. No. 536,650, Sep. 29, 1995, abandoned, which is a continuation-in-part of Ser. No. 202,142, Feb. 25, 1994, abandoned.

[51] Int. Cl.$^6$ .................................................. C23C 16/00
[52] U.S. Cl. ............................ 118/730; 118/728; 118/500
[58] Field of Search .................................. 118/728, 730, 118/500

[56] References Cited

U.S. PATENT DOCUMENTS

| | | | |
|---|---|---|---|
| 4,710,428 | 12/1987 | Tamamizu | 428/408 |
| 5,148,714 | 9/1992 | McDiarmid | 74/89.15 |
| 5,192,371 | 3/1993 | Shuto | 118/728 |
| 5,228,052 | 7/1993 | Kikuchi | 373/18 |
| 5,269,847 | 12/1993 | Anderson | 118/715 |
| 5,334,257 | 8/1994 | Nishi | 118/500 |
| 5,492,566 | 2/1996 | Sumnitsch | 118/500 |

FOREIGN PATENT DOCUMENTS

| | | | |
|---|---|---|---|
| 2554250A1 | 10/1984 | France . | |
| 230714 | 12/1985 | Germany | 118/728 |
| 3942931 | 6/1990 | Germany | 118/728 |
| 4107752A1 | 3/1991 | Germany . | |
| 61-66967 | 7/1986 | Japan | 118/728 |
| 62-20309 | 1/1987 | Japan | 118/728 |

*Primary Examiner*—R. Bruce Breneman
*Assistant Examiner*—Jeffrie R. Lund

[57] ABSTRACT

An apparatus for depositing a material on a wafer includes a susceptor plate mounted in a deposition chamber. The chamber has a gas inlet and a gas exhaust. Means are provided for heating the susceptor plate. The susceptor plate has a plurality of support posts projecting from its top surface. The support posts are arranged to support a wafer thereon with the back surface of the wafer being spaced from the surface of the susceptor plate. The support posts are of a length so that the wafer is spaced from the susceptor plate a distance sufficient to allow deposition gas to flow and/or diffuse between the wafer and the susceptor plate, but still allow heat transfer from the susceptor plate to the wafer mainly by conduction. The susceptor plate is also provided with means, such as retaining pins or a recess, to prevent lateral movement of a wafer seated on the support posts.

24 Claims, 3 Drawing Sheets

SUSCEPTOR FOR DEPOSITION APPARATUS

This is a continuation of application Ser. No. 08/536,650, filed Sep. 29, 1995 now abandoned, which is a continuation in part of U.S. application Ser. No. 08/202,142 filed Feb. 25, 1994; now abandoned.

FIELD OF THE INVENTION

The present invention is directed to a susceptor for supporting a wafer in a deposition apparatus for depositing a layer of a material on the surface of the wafer, and, more particularly, to a susceptor which allows deposition on both surfaces of the wafer.

BACKGROUND OF THE INVENTION

One type of deposition apparatus used in the semiconductor industry is a single wafer chamber apparatus in which one wafer at a time is placed in the deposition chamber and a layer of a material is deposited on the wafer. Referring to FIG. 1, there is shown one form of a typical single wafer deposition apparatus 10. Deposition apparatus 10 comprises an enclosed chamber 12 formed by an upper dome 14, a lower dome 16 and a side wall 18 between the upper and lower domes 14 and 16. A flat susceptor 20 is mounted in and extends across the chamber 12. The susceptor is generally mounted on a shaft 22 which provides for rotation of the susceptor 20. A pre-heat ring 21 is around the periphery of the susceptor 20 and extends between the susceptor 20 and the side wall 18. A deposition gas inlet port 24 extends through the side wall 18 of the chamber 12. An exhaust port 26 also extends through the side wall 18 of the chamber 12. An exhaust port 26 also extends through the side wall 18 substantially diagonally opposite the inlet port 24. Heating means, such as lamps 28, are mounted around the chamber 12 and direct their light through the upper and lower domes 14 and 16 onto the susceptor 20 and pre-heat ring 21 to heat the susceptor 20 and the pre-heat ring 21. A door, not shown, is also provided in the side wall 18 through which wafers can be inserted into and removed from the chamber 12.

To deposit a layer of a material, such as silicon, on the surface of a wafer 30, the wafer 30 is placed on the susceptor 20 and a flow of a deposition gas is provided across the chamber 12 from the inlet port 24 to the exhaust port 26. To deposit silicon, the gas used contains a silicon containing material, such as silane, and an inert carrier gas, such as hydrogen. The susceptor 20 and wafer 30 are heated by the lamps 28. The heated susceptor 20, pre-heat ring 21 and wafer 30 heat the deposition gas passing over their surfaces causing the gas to react and deposit a layer of the material, silicon, on the surface of the wafer 30.

The heat from the lamps 28 is absorbed by the susceptor 20 and is normally transferred to the wafer 30 by conduction across a thin interface between the wafer 30 and the susceptor 20. The wafer 30 and susceptor 20 are in fairly intimate contact with the wafer 30 being mounted on the susceptor 20. However, as shown in FIG. 2, the surface of the susceptor 20 is not perfectly smooth, but has some roughness. Because of the surface roughness of the susceptor 20, the wafer 30 actually only contacts the surface of the susceptor 20 at a few points. The flatness of the wafer 30 and the susceptor 20 are within a few thousandths of an inch so that the heat is readily conductive through the gas molecules that occupy the space between the wafer 30 and the susceptor 20. As shown in FIG. 3, in some cases, the surface of the susceptor 20 is curved or recessed away from the wafer 30 (typically 2 to 10 thousands of an inch) to avoid hot spots resulting from the point contact of the wafer and susceptor. However, in either case, the primary heat transfer between the wafer 30 and susceptor 20 is conduction across the gas film between the wafer 30 and susceptor 20. Radiation heat transfer does occur, but is of secondary importance because of the close spacing of the wafer 30 to the susceptor 20.

During the process of depositing a layer of a material, such as silicon, on the surface of the wafer 30, molecules containing the material, typically silane for silicon, diffuse to the back surface of the wafer 30. This results from the fact that the molecules are driven by a partial pressure difference since there are initially no such molecules between the wafer 30 and the susceptor 20. These atoms thermally decompose and deposit silicon on the back surface of the wafer 30 and the corresponding surface of the susceptor 20. However, this deposition is typically confined to a few millimeters from the edge of the wafer 30. For the manufacture of certain types of semiconductor devices, such as integrated circuits, it is sometimes desirable to deposit silicon on the entire back surface of the wafer 30 as well as on the front surface of the wafer 30. Although uniformity of the layer deposited on the back surface of the wafer 30 is not an issue, it is important to have complete coverage. Also, for time saving, it would be desirable to be able to coat the back surface of the wafer 30 at the same time that the coating is being applied to the front surface of the wafer 30.

As one example of the need for complete coverage of a coated wafer in a cold wall CVD process where the wafer is being prepared for certain applications, FIG. 7 demonstrates a wafer 70 in which incomplete coverage of the underside has taken place. As shown, a polysilicon layer 71 is deposited on a silicon wafer substrate 72. In most applications the wafer substrate will generally have a thin coating of silicon dioxide ($SiO_2$) 73 which acts as an interface layer for the overcoated polysilicon layer 71.

When a polysilicon coating 71 is applied by means of a cold wall CVD apparatus as shown in FIG. 1, the coverage on the wafer is incomplete, generally coating the outer periphery of the underside of the wafer to a distance of ¼ inches to ¾ inches from the wafer's edge of the wafer. This leaves a significant portion 76 of the underside oxide interface coating exposed which increases the risks of a defective wafer in certain applications. For example, certain wafer uses require a hydrofluoric acid (HF) dip as a step after the chemical vapor deposition of the polysilicon. In such a step the HF will etch the exposed underside portion 76 of the silicon dioxide layer 73. This erosion will cause a gap 75 between the polysilicon 71 and the underside oxide. Such loose ends of the polysilicon as shown in FIG. 7 will enevitably generate flakes of loose polysilicon particles. These particulate flakes become contaminants to the HF bath and the wafer itself becomes a source of potential contamination in any subsequent fabrication processing of the wafer. This example amply demonstrates the need for a device and process for securing total coverage of a wafer substrate in a cold wall/heated susceptor application.

SUMMARY OF THE INVENTION

One aspect of the present invention is directed to a susceptor for an apparatus for depositing a layer of a material on the surface of a wafer. The susceptor comprises a plate having a surface. A plurality of support posts project from the surface of the plate. The support posts are arranged in spaced relation in a pattern which permits a wafer to be seated on the support posts with the wafer being spaced from the surface of the plate.

Another aspect of the present invention is directed to an apparatus for depositing a layer of a material on a wafer which comprises a deposition chamber, a circular susceptor plate in the chamber and mounted on a shaft for rotation, a gas inlet into the chamber, an exhaust from the chamber and means for heating the susceptor plate. The susceptor plate has a plurality of support posts projecting from a top surface thereof. The support posts are arranged in spaced relation in a pattern which permits a wafer to be seated on the support posts with the wafer being spaced from the surface of the susceptor plate.

DETAILED DESCRIPTION

Figure 4:
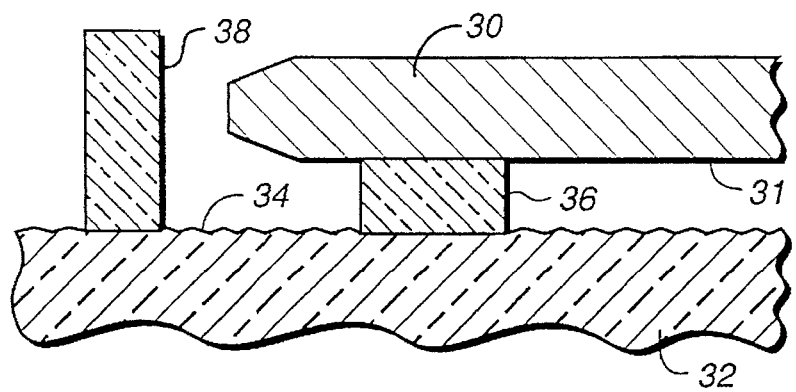
FIG. 4 is a sectional view of a portion one form of the susceptor in accordance with the present invention.
Figure 5:
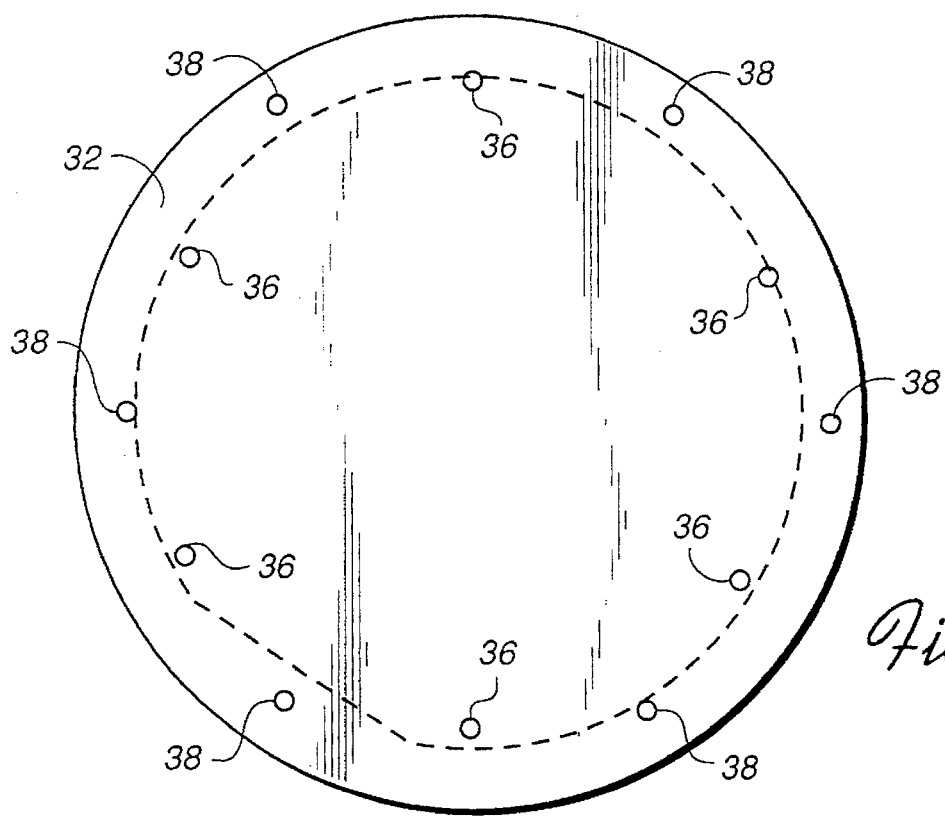
FIG. 5 is a top view of the susceptor shown in FIG. 4.

Referring now to FIG. 4, there is shown a sectional view of one form of a susceptor 32 in accordance with the present invention. Susceptor 32 is a circular plate having a relatively flat top surface 34, and a shaft (not shown) secured to the center of its bottom surface. Projecting upwardly from the top surface 34 are plurality of support posts 36. The support posts 36 are in spaced relation around a circle which is of a diameter slightly less than the diameter of the wafer 30 to be treated on the susceptor 32. There should be at least three support posts 36, and as shown in FIG. 5, there are preferably six support posts 36 on the susceptor 32. Thus, the support posts 36 are adapted to support a wafer 30 thereon with the back surface 31 of the wafer 30 being slightly spaced from the top surface 34 of the susceptor 32. The support posts 36 are of a length to space the back surface 31 of the wafer 30 from the top surface 34 of the susceptor 32 a distance sufficient to allow molecules of the deposition gas to diffuse completely across the back surface of the wafer 30. However, the spacing mush be close enough to provide for a significant portion of the heat transfer from the susceptor 32 to the wafer 30 to be conduction; that is, the spacing must minimally be of a value to retain heat conduction coupling between the heated susceptor 30 and the wafer substrate 32 to be coated. However, since the wafer 30 is spaced from the surface 34 of the susceptor 32, radiation heat transfer becomes much more important than when the wafer is directly on the surface of the susceptor. While the lengths of the support pins 36 can be of any value that achieves the heat coupling between the susceptor 32 and the substrate 30 to accomplish the full coverage coating of the wafer substrate, typical lengths range from 0.5 millimeters to 10 millimeters. Preferred wafer coating results have been found with pin lengths of 1 millimeter to 6 millimeters.

The diameter of the support pins 36 should be sufficient to provide good support for the wafer 30, but not large enough to cover a significant area of the back surface 31 of the wafer 30. A typical diameter for the support pins 36 is from one to three millimeters.

Also projecting from the top surface 34 of the susceptor 32 are a plurality of retaining pins 38. The retaining pins 38 are arranged in spaced relation around a circle which is of a diameter slightly larger than the diameter of the wafer 30 to be treated on the susceptor 32. Although three of the retaining pins 38 can be used, as shown in FIG. 5, six of the retaining pins 38 are preferred. The retaining pins 38 are of a length longer than the length of the support pins 36, preferably by a distance at least equal to the thickness of the wafer 30. Typically, the retaining pins 38 are of a length at least one-half millimeter longer than the length of the support pins 36.

Figure 1:
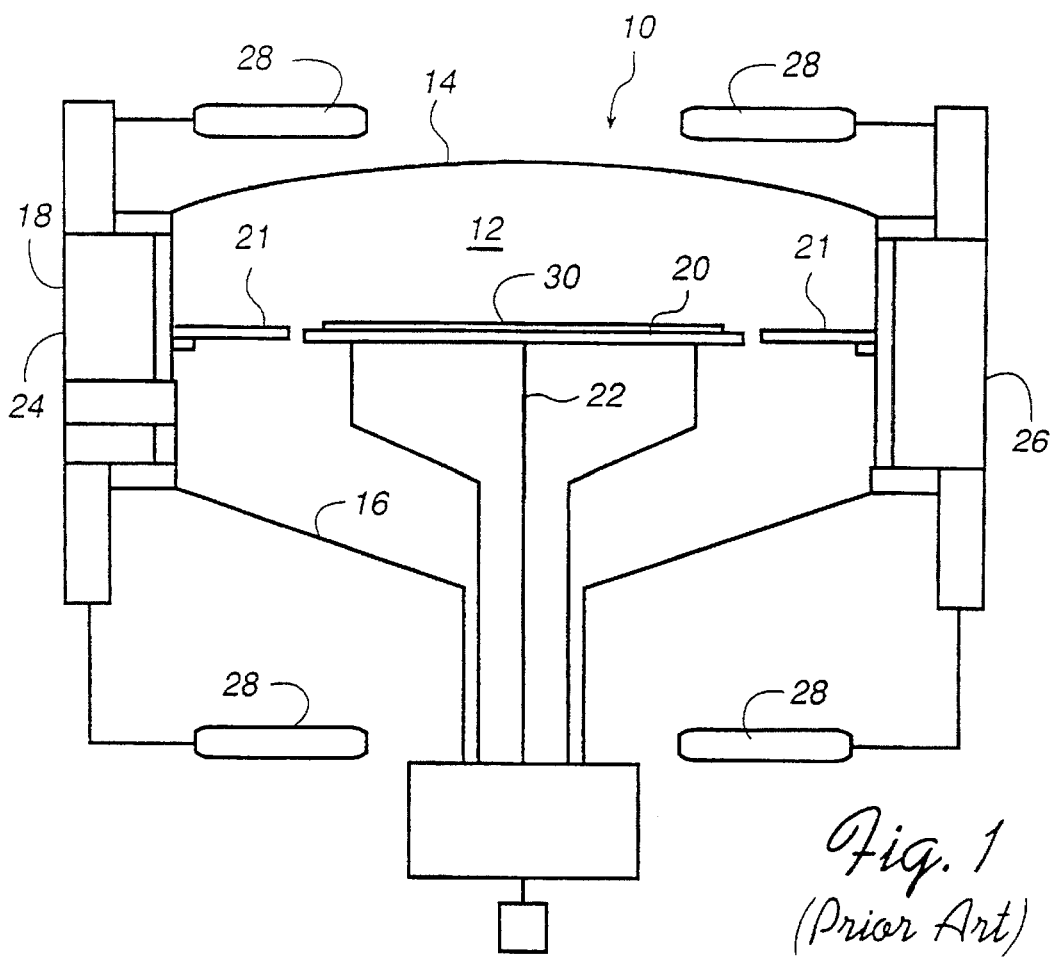
FIG. 1 is a schematic sectional view of a prior art single wafer deposition apparatus.
Figure 2:
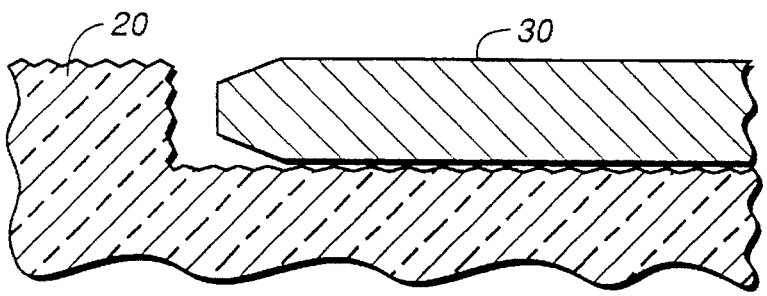
FIG. 2 is an enlarge sectional view of a portion of one form of a susceptor used in the apparatus shown in FIG. 1.
Figure 3:
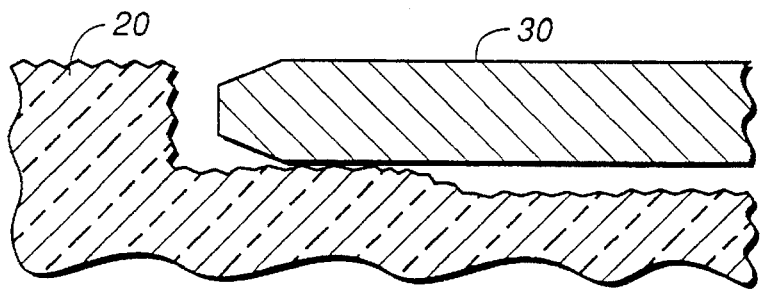
FIG. 3 is an enlarge sectional view of a portion of another form of a susceptor used in the apparatus shown in FIG. 1.

The susceptor 32 of the present invention is used in a heated susceptor/cold wall deposition apparatus 10 such as shown in FIG. 1 and replaces the susceptor 20 shown in FIG. 1. A wafer 30 is placed on the susceptor 32 and is seated on the support pins 36 within the retaining pins 38. The retaining pins 38 prevent lateral movement of the wafer 30 as the susceptor 32 rotates during the deposition operation. A deposition gas is fed into the chamber 12, and the susceptor 32 is heated by the lamps 28. The susceptor 32 heats the wafer 30 mainly by conduction, but partially by radiation. The deposition gas not only flows across the top surface of the wafer 30, but also flows and/or diffuses between the back surface 31 of the wafer 30 and the top surface 34 of the susceptor 32. Since the back surface 31 of the wafer 30 is spaced from the top surface 34 of the susceptor 32 by the support posts 36, some of the deposition gas flows and/or diffuses completely across the back surface 31 of the wafer 30. The heated wafer 30 heats the deposition gas which contacts its surfaces causing the deposition gas to react and deposit a layer of the material over both surfaces of the wafer 30. Thus, the susceptor 32 of the present invention provides for coating the back surface 31 of the wafer 30 at the same time that the top surface is coated, but still achieves heating of the wafer 30 mainly by conduction from the susceptor 32.

Figure 6:
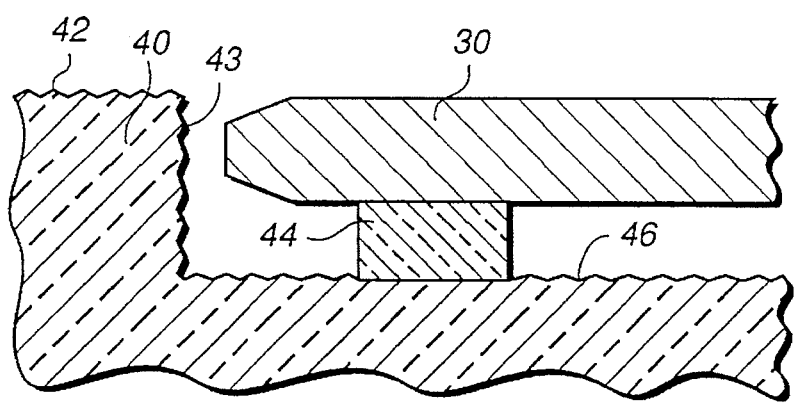
FIG. 6 is a sectional view of a portion of another form of a susceptor in accordance with the present invention.
Figure 7:
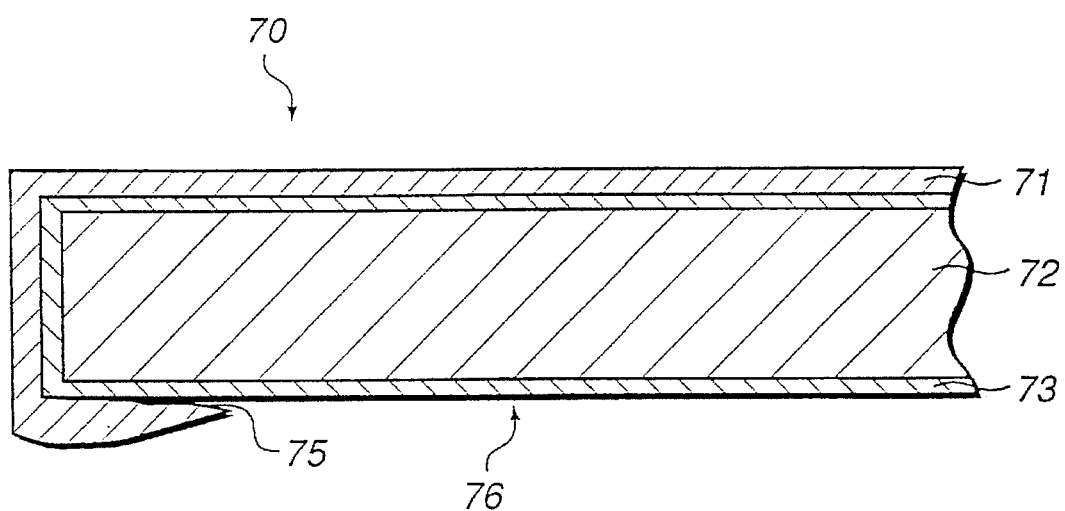
FIG. 7 is a sectional view of a wafer processed in accordance with the prior art.

Referring now to FIG. 6, there is shown another form of a susceptor 40 in accordance with the present invention. Susceptor 40 comprises a circular plate having a top surface 42 and a circular recess 43 in the top surface 42. A plurality of support posts 44 project upwardly from the bottom surface 46 of the recess 44. The support posts 44, like the support posts 36 of the susceptor 32, are arranged in spaced relation around a circle which is of a diameter slightly less than the diameter of the wafer 30 to be supported thereon. The susceptor 40 can have the same number of support posts 44 as the susceptor 32 shown in FIGS. 4 and 5. The support posts 44 are of a length to support the wafer 30 spaced from the bottom surface 46 of the recess 43, but still allow heat transfer from the susceptor 40 to the wafer 30 mainly by conduction. The support posts 44 typically have a length of one-half to two millimeters and have a diameter typically about one to three millimeters. The recess 44 is of a diameter slightly greater than the diameter of the wafer 30 to be treated on the susceptor 40. Also, the depth of the recess 43 is greater than the length of the support posts 44, typically by about one-half millimeter or more.

The susceptor 40 is also used in the deposition apparatus 10 shown in FIG. 1 in place of the susceptor 20. In the use of the susceptor 40, a wafer 30 is placed in the recess 43 in the susceptor 40 with the back surface 31 of the wafer 30 being seated on the support posts 44. A flow of a deposition gas is provided in the chamber 12 and the susceptor 40 and wafer 30 are heated by means of the lamps 28. Additionally, some heat is transferred from the susceptor 40 to the wafer 30. This heats the deposition gas which flows over the top surface of the wafer 30 so that the gas reacts to deposit a layer of a material on the top surface of the wafer 30. At the same time, some of the deposition gas flows and/or diffuses around the edge of the wafer 30 and between the back surface 31 of the wafer 30 and the bottom surface 46 of the recess 43. The gas which is between the back surface 31 of the wafer 30 and the bottom surface 46 of the recess 43 is heated and reacts to deposit a layer of the material on the back surface 31 of the wafer 30. Thus, a layer of the material is simultaneously deposited on both the top and bottom surfaces of the wafer 30.

Thus, there is provided by the present invention a susceptor for a deposition apparatus which supports a wafer slightly spaced from the surface of the susceptor. This allows the deposition gas to pass both over the top surface of the wafer and between the bottom surface of the wafer and the susceptor. Thus, when the deposition gas is heated by the heated wafer, the deposition gas reacts to deposit a layer of the material simultaneously on both the top and bottom surfaces of the wafer. Although the wafer is supported spaced from the surface of the susceptor, the spacing is small enough that the heat transfer between the susceptor and the wafer is mainly by conduction and only a small part by radiation. Thus, the wafer is still readily and quickly heated by the susceptor. Although the support pins and retaining pins are shown as being arranged in a circle to support a circular wafer, the pins can be arranged in any shaped closed figure, such as square, rectangular, triangular, etc., to support a wafer of any shape.

What is claimed is:

1. A susceptor for an apparatus for depositing a layer of a material on a surface of a wafer comprising:

a plate having a continuous surface; and a plurality of support posts coupled to and projecting from the continuous surface of the plate, said support posts being arranged in spaced relation in a pattern which permits a wafer to be seated on the support posts with the wafer being spaced from the surface of the plate said support posts being sized and spaced sufficient to allow a gas to flow and/or diffuse between said continuous surface and substantially the entire back surface of the wafer, but still allow heat transfer from the plate to the wafer mainly by conduction.

2. The susceptor of claim 1 in which the susceptor posts are arranged along a circle whose diameter is slightly less than the diamater of the wafer to be seated hereon.

3. The susceptor of claim 2 in which there are at least three support posts projecting from the surface of the plate.

4. The susceptor of claim 3 in which there are six support posts projecting from the surface of the plate.

5. The susceptor of claim 2 in which the support posts are of a length of between one-half to ten millimeters.

6. The susceptor of claim 5 in which the support posts are of diameter of about three millimeters.

7. The susceptor of claim 2 in which the support posts are of a length of between one to six millimeters.

8. The susceptor of claim 2 further comprising a plurality of retaining pins projecting from the surface of the plate, said retaining pins being longer than the support posts and being positioned so that a wafer mounted on the support posts is within the retaining pins.

9. The susceptor of a claim 8 in which the retaining pins are spaced around a circle whose diameter is slightly greater than the diameter of the wafer to be seated on the support posts.

10. The susceptor of claim 9 in which the retaining pins are of a length at least one-half millimeter longer than the length of the support pins.

11. The susceptor of claim 2 in which the plate has a top surface and a recess in the top surface, said recess having a bottom surface and the support posts project from the bottom surface of the recess.

12. The susceptor of claim 11 in which the recess has a diameter which is slightly greater than the diameter of the wafer to be seated on the support posts, and has a depth greater than the length of the support posts.

13. An apparatus for depositing a layer of a material on a wafer comprising:

a deposition chamber;

a circular susceptor plate in the chamber and mounted on a shaft for rotation, said susceptor plate having a surface at the top thereof and a plurality of support posts projecting from said surface, said support posts being arranged in spaced relation in a pattern which permits a wafer to be seated on the support posts with the wafer being spaced from the surface of the susceptor plate to allow a gas to flow and/or diffuse between said susceptor plate and substantially the entire back surface of the wafer;

a gas inlet into the chamber; and a gas outlet from the chamber.

14. The apparatus of claim 13 in which the support posts on the susceptor plate are of a length to space the wafer from the surface of the susceptor plate a distance sufficient to allow a deposition gas to flow and/or diffuse between the wafer and the surface of the susceptor plate but still allow heat transfer from the susceptor plate to the wafer mainly by conduction.

15. The apparatus of claim 14 in which the support posts are of length of between one-half to 10 millimeters and of a diameter of about three millimeters.

16. The apparatus of claim 14 further comprising a plurality of retaining pins projecting from the surface of the susceptor plate, said retaining pins being longer than the support posts and being positioned so that a wafer seated on the support post is within the retaining pins.

17. The apparatus of claim 16 in which the retaining pins are spaced around a circle whose diameter is slightly greater than the diameter of the wafer to be seated on the support posts.

18. The apparatus of claim 17 in which the retaining pins are of a length at least one-half millimeter longer than the length of the support posts.

19. The susceptor of claim 14 in which the susceptor plate has a recess in its top surface with the recess having a bottom surface, and the support posts project from the bottom surface of the recess.

20. The susceptor of claim 19 in which the recess has a diameter which is slightly greater than the diameter of the wafer to be seated on the support posts and a depth which is slightly greater than the length of the support posts.

21. The apparatus of claim 13 in which the support posts are arranged along a circle whose diameter is slightly less than the diameter of the wafer.

22. The apparatus of claim 21 in which there are at least three support posts projecting from the surface of the susceptor plate.

23. The apparatus of claim 13 further comprising means for heating the susceptor plate.

24. The apparatus of claim 23 wherein said means comprises a lamp.

* * * * *